METHOD OF PREPARING SEMI-CONDUCTOR JUNCTIONS

Filed April 5, 1956 3 Sheets-Sheet 1

ROBERT G. POHL
*INVENTOR.*

BY John J. Pederson

HIS ATTORNEY.

ROBERT G. POHL
*INVENTOR.*

BY John J. Pederson

HIS ATTORNEY.

June 4, 1963 R. G. POHL 3,092,521
METHOD OF PREPARING SEMI-CONDUCTOR JUNCTIONS
Filed April 5, 1956 3 Sheets-Sheet 3

ROBERT G. POHL
*INVENTOR.*
BY John J. Pederson
HIS ATTORNEY.

3,092,521
Patented June 4, 1963

3,092,521

METHOD OF PREPARING SEMI-CONDUCTOR JUNCTIONS

Robert G. Pohl, Chicago, Ill., assignor to The Rauland Corporation, a corporation of Illinois Filed Apr. 5, 1956, Ser. No. 576,409
3 Claims. (Cl. 148—1.5)

This invention is directed to a new and improved method of preparing an alloy-type junction upon the surface of a semi-conductor. The invention is also concerned with a method of manufacturing semi-conductor signal-translating devices.

At present, one widely used fabrication technique for the manufacture of transistors and other semi-conductor devices is based upon the alloying of a small quantity of a modifier element into a semi-conductor crystal. The essential physical property utilized in this method is the solubility of germanium and silicon, the most commonly used semi-conductors, in liquid solutions of various other elements. The alloying process is carried out at a temperature well below the melting point of the semi-conductor; consequently, the basic semi-conductor crystal lattice is not altered by the surface alloying process. The relatively high values of current gain obtained with transistors of the alloy type indicate that modifier element atoms diffuse a very small distance into the bulk of the non-dissolved crystal lattice while the semi-conductor and modifier are maintained at the alloying temperature.

Although semi-conductor devices employing alloy-type junctions are now in widespread commercial use, there are certain basic difficulties in the conventional alloying process which lead to an undesirably high reject rate in the manufacturing procedure. One of these problems is attributable to the fact that introduction of the modifier element atoms into the semi-conductor crystal lattice tends to take place irregularly over the surface of the semi-conductor; as a consequence, it is extremely difficult to control the thickness of the semi-conductor layer underlying the alloy junction. In addition, the backward impedance of devices manufactured by conventional alloying techniques is not as high as could be desired.

It is an object of the invention, therefore, to provide a new and improved method of preparing an alloy-type junction upon a selected surface of a semi-conductor, which method effectively eliminates or minimizes the above-noted disadvantages of known processes.

It is another object of the invention to provide a new and improved method of preparing an alloy-type junction upon the surface of a semi-conductor, the junction exhibiting a substantially higher reverse impedance than provided by conventional alloying processes.

It is an additional object of the invention to provide a new and improved method of establishing an alloy-type junction upon the surface of a semi-conductor in which the penetration of the junction into the semi-conductor is relatively uniform and consequently subject to more accurate control than in previous processes.

It is a corollary object of the invention to provide a new and improved method of preparing an alloy-type junction upon a surface of a semi-conductor which may be carried out by means of relatively inexpensive and simple apparatus.

A method of preparing an alloy-type junction upon a selected surface of a semi-conductor in accordance with the invention comprises the following steps: A modifier having a melting point substantially below the melting point of the semi-conductor is deposited upon the selected surface. At least a portion of the modifier is then heated to a temperature above the melting point of the modifier but below the melting point of the semi-conductor for a predetermined period to melt a portion of the modifier and dissolve a portion of the semi-conductor into the molten modifier to form a junction comprising an alloy of the modifier and the semi-conductor. During at least a portion of the period when the modifier is heated above its melting point, it is contacted with a vibration-translating element. This vibration-translating element is subjected to vibrations within predetermined frequency ranges, preferably including ultrasonic frequencies and low frequencies, during at least a portion of the time during which that element is in contact with the modifier. In a preferred embodiment of the invention, the vibration-translating element comprises an electrically conductive wire or rod which later forms one of the leads for a completed semi-conductor signal-translating device.

The features of the invention which are believed to be new are set forth with particularity in the appended claims. The invention, together with further objects and advantages thereof, may best be understood, however, by reference to the following description when taken in conjunction with the accompanying drawings, in the several figures of which like reference numerals indicate like elements and in which:

Figure 1:
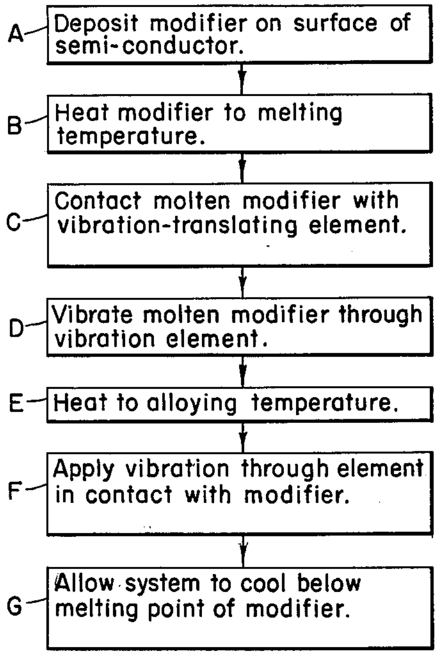
FIGURE 1 is a flow-chart illustrating the process steps in a preferred embodiment of the invention.

Before discussing the process of the invention illustrated by the flow-chart of FIGURE 1, a more detailed description of the conventional alloying process to the improvement of which the invention is directed is desirable in order to point up the fundamental differences between the invention and previously known techniques. The basic semi-conductor material in the conventional process usually comprises silicon or germanium. A relatively small, thin wafer of semi-conductor material is employed; in a typical instance, the semi-conductor wafer may be approximately one-tenth inch in length, one-tenth inch in width, and .003 inch in thickness. The length and width of the wafer are not critical and are selected to provide a surface of adequate area without wasting semi-conductor material. The thickness is of greater importance in determining the characteristics of the completed device, but also may vary within substantial limits, since the alloying process itself determines to a substantial extent the ultimate effective thickness of the semi-conductor wafer in the critical area underlying the alloy junctions. The wafer is cut from a single semi-conductor crystal, since any discontinuity in the crystal lattice may lead to highly unpredictable and undesirable characteristics in the finished semi-conductor device. The semi-conductor material is not of the "intrinsic" variety; rather, it should exhibit either n-type or p-type conductivity characteristics.

Assuming that n-type germanium is selected as the basic semi-conductor material, the modifier element employed in the conventional process may comprises any acceptor element having a melting point substantially lower than that of germanium; indium is most commonly employed. Where p-type semi-conductive material is utilized as the basic semi-conductor, antimony or some other suitable donor may be used as a modifier. Using the n-type germanium with indium as a modifier, a small quantity of the modifier is deposited upon one surface of the germanium wafer and the semi-conductor and modifier are heated to a temperature above the melting point of the indium but below that of the germanium for a period of time sufficient to melt the indium and dissolve a portion of the germanium into the indium; upon cooling, an n-p junction comprising an alloy of the modifier and the semi-conductor is formed. Penetration of the junction layer into the semi-conductor is to some extent controllable by adjustment of the alloying temperature and the length of the alloying process, although, as noted above, for a given temperature and heating period the penetration may vary substantially because of indeterminacy in the initiation of the wetting process due to surface oxide films, leading to a relatively high reject rate where this process is employed.

The inventive process illustrated by the flow-chart of FIGURE 1 is in many respects essentially similar to the conventional technique outlined above. As in the known process, a relatively small quantity of the selected modifier is first deposited upon the surface of the semi-conductor wafer, as indicated at stage A of the flow-chart. At least a portion of the modifier is then heated to a temperature above the melting point of the modifier but substantially below the melting point of the semi-conductor, as indicated in stage B. In the preferred embodiment illustrated in FIGURE 1, the modifier is not heated to the alloying temperature in stage B but rather brought to a temperature just high enough to melt the modifier element. When the modifier has reached the molten state, a vibrator element is brought into contact with the modifier and vibration is applied to the modifier through that element. These two steps in the process are indicated in the flow-chart as stages C and D. In the next subsequent step of the process, stage E, the modifier is heated to the desired alloying temperature. As in the conventional technique described above, the modifier is maintained at the alloying temperature for a predetermined period sufficient to dissolve a portion of the semi-conductor material into the molten modifier to form a junction comprising an alloy of the modifier and the semi-conductor. During this alloying period, vibration is again applied to the modifier through the vibration-translating element as indicated in stage F of the flow-chart. In the final stage of the process, step G in the chart, the system is cooled below the melting point of the modifier to permit the modifier to solidify.

Although it is preferred that the complete sequence of steps illustrated in FIGURE 1 be utilized in practicing the invention, the process can be somewhat simplified and yet retain substantial advantages as compared with previously known techniques. The most important modification which may be made without departing from the inventive concept is the elimination of the low-temperature melting stage B; the modifier may be heated directly to the alloying temperature, stage E, without substantial interruption at the lower temperature. When this is done, only a single vibration stage F is required, although the application of vibration to the modifier need not be continuous but may be accomplished in discrete steps during the alloying process.

In order to provide a more complete illustration of the inventive concept, a detailed description of one embodiment of the inventive method is set forth hereinafter; it should be understood that this material is provided solely by way of illustration and in no sense as a limitation upon the invention. The basic semi-conductive material employed is n-type germanium having a resistivity of approximately 3 ohm centimeters. The germanium wafers employed are approximately .075 inch in length, .075 inch in width and .003 inch in thickness. The modifier employed is indium; a pellet of approximately .00016 gram is applied to the surface of the semi-conductor. The semi-conductor wafer and the modifier pellet both are then heated to approximately 350° C. to melt the indium. A fine wire, .004 inch stainless steel, which is later employed as one of the leads on the finished semi-conductor device, is then brought in contact with the molten indium. This wire is employed as a vibration-translating element and is utilized to subject the modifier to vibration within a predetermined frequency range for approximately 15 seconds while the indium is maintained at 350° C. The vibration-translating wire is vibrated at an ultrasonic frequency; 20 kc. has been employed with excellent results, but the frequency is not particularly critical. In addition to this high frequency or "fine" vibration, the vibration element is also preferably vibrated at a much lower frequency, hereinafter termed the "gross" frequency. This "gross" vibration is also subject to wide vibration and usually is in the range of a few hundred cycles per second. The "gross" and "fine" vibration steps may be applied successively, but preferably are carried out simultaneously.

After the initial deposition, heating, contacting, and vibrating stages of the process have been completed (steps A, B, C and D in the flow-chart of FIGURE 1), the modifier and semi-conductor are heated to the desired alloying temperature. This alloying temperature must be below the melting temperature of the semi-conductor, in this instance germanium, and should also be substantially higher than the melting point of the modifier, indium in this particular embodiment. Using germanium and indium, the alloying temperature may range from 450 to 600° C.; in this particular process a temperature of approximately 525° C. has been found quite satisfactory. The modifier and the semi-conductor are maintained at this temperature for a predetermined period sufficient to melt a portion of the modifier and dissolve some of the semi-conductor into the molten indium to form the desired junction; this period may, for example, be 45 second to one minute in duration. During the alloying period, the vibration-translating lead wire is maintained in contact with the molten modifier and is again utilized to subject the indium to vibration at both the fine and gross frequencies. The period of vibration may be approximately 30 seconds. The gross or low-frequency vibration assists in mixing the germanium and indium more uniformly as the germanium is dissolved into the molten indium. The ultrasonic vibration causes cavitation in the molten indium, tending to erode the germanium and any surface oxides uniformly over the surface covered by the indium; as a consequence, the alloying process is accelerated and made more uniform in respect to the wetting of the germanium by the indium in successive units.

Transistors manufactured by the above-described alloying process exhibit consistently higher reverse resistance than otherwise similar devices manufactured by a corresponding technique in which the critical vibration steps of the inventive process are omitted. For example, transistors manufactured in accordance with the detailed process using n-type germanium and indium set forth above have a reverse resistance of approximately 100,000 ohms or more prior to etching as compared to resistances of the order of 10,000 ohms obtained with the most nearly corresponding prior art technique. In addition, the inventive method provides for much more consistent depth of penetration of the alloy junction into the semi-conductor wafer for given process conditions. The significance of this feature of the invention is emphasized by the fact that in the usual p-n-p transistor two alloy junctions are formed on opposite faces of the semi-conductor wafer, the useful operating frequency range of the resulting device being very dependent upon the thickness of the unmodified n-type germanium layer interposed between the two junctions.

Figure 2:
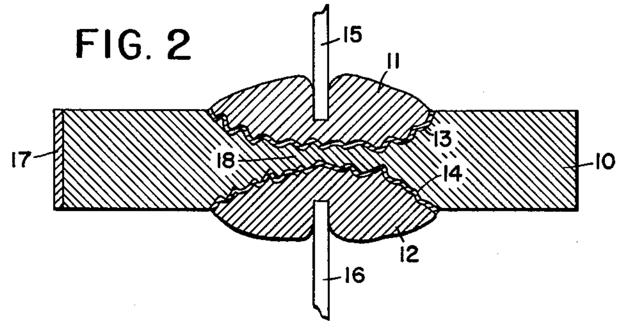
FIGURE 2 is a greatly enlarged cross-sectional view of an alloy-type junction transistor manufactured in accordance with conventional procedures.
Figure 3:
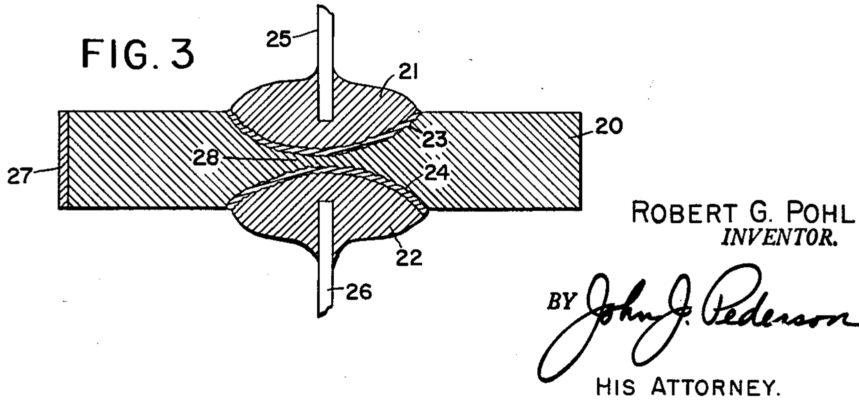
FIGURE 3 is a cross-sectional view, similar to FIGURE 2, showing a junction transistor manufactured in accordance with the inventive method.

Some of the important differences between alloy-type junction devices formed by conventional techniques and those prepared in accordance with the invention are illustrated in FIGURES 2 and 3. FIGURE 2 is a cross-sectional view of a junction transistor manufactured in accordance with conventional techniques and comprises a semi-conductor wafer 10 to which two modifier layers 11 and 12 have been alloyed in accordance with the conventional technique described above. The barrier junctions are illustrated by layers 13 and 14 intermediate modifier layers 11 and 12 respectively and semi-conductor 10. The collector and emitter leads for the transistor are shown as wires 15 and 16 electrically and mechanically connected to modifier layers 11 and 12 respectively as by soldering or any other suitable technique, and the base electrode 17 comprises a metallic layer in ohmic contact with one end of semi-conductor wafer 10. As indicated in FIGURE 2, junction layers 13 and 14 are quite irregular in configuration; as is readily apparent in the drawing, it is extremely difficult to maintain consistent control of the thickness of the layer 18 of unmodified semi-conductive material separating the two junction layers. Consequently, as indicated above, two devices of this type formed by exactly similar processes may exhibit markedly different electrical characteristics, resulting in an excessive reject rate.

FIGURE 3 is a cross-sectional view essentially similar to that of FIGURE 2 except that it illustrates an alloy-type junction transistor manufactured in accordance with the inventive method. The basic semi-conductive wafer 20 is essentially similar to wafer 10 of FIGURE 2 and has been alloyed with the two modifier element layers 21 and 22 corresponding to modifier layers 11 and 12 respectively of the conventional device. Modifier layer 21 is separated from semi-conductor 20 by an alloy junction layer 23, whereas an alloy junction layer 24 is interposed between modifier 22 and the semi-conductor base. Individual leads 25 and 26 are provided for modifier layers 21 and 22 respectively; as indicated above, leads 25 and 26 have preferably been employed to effect the desired vibration of the modifiers during the alloying process. The transistor of FIGURE 3 may also be provided with a base electrode 27 in ohmic contact with semi-conductor wafer 20.

In the semi-conductor device manufactured according to the invention, irregularities in the configuration of junction layers 23 and 24 are substantially minimized; penetration of the alloy layer into the basic semi-conductive material is much more regular and consistent. Consequently, the thickness of the layer 28 of semi-conductive material separating the two junction layers 23 and 24 is quite consistent in devices manufactured under given process conditions and the reject rate is substantially reduced as compared with conventional processes. The magnitude of this improvement is apparent from the fact that where relatively stringent tolerances in electrical characteristics are required, as in transistors intended for use at radio frequencies, the reject rate on transistors produced by conventional techniques may run as high as 90%, whereas when the inventive technique is applied to an otherwise similar process the same close tolerances may be maintained on all but 10% or less of the transistors manufactured.

Figure 4:
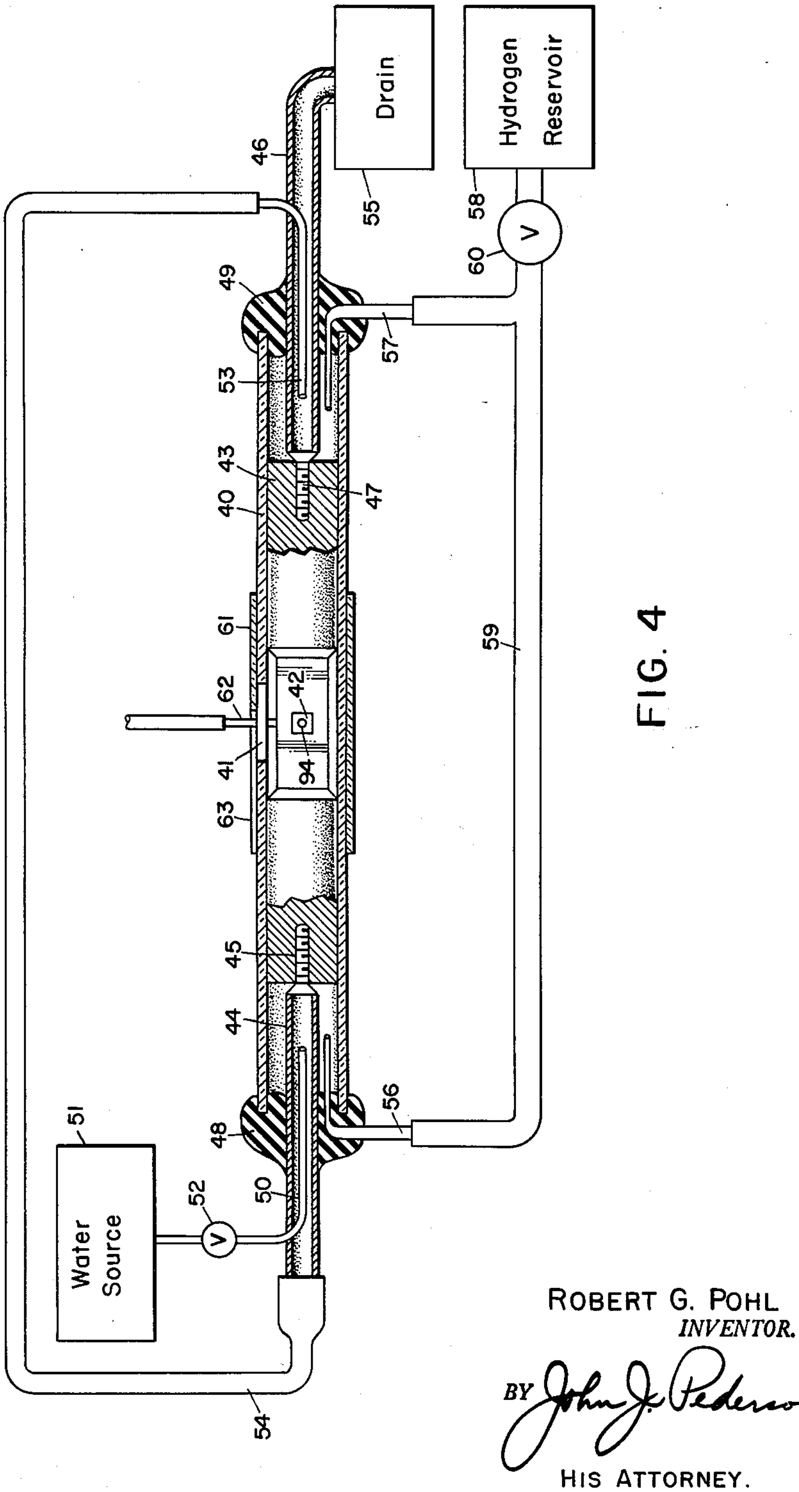
FIGURE 4 is a cross-sectional plan view of a portion of one type of apparatus which may be employed to carry out the inventive process.

FIGURE 4 is a cross-sectional plan view of a relatively simple and inexpensive type of apparatus which may be employed to carry out the inventive process. The apparatus comprises a fused quartz tube 40 having a central opening indicated by numeral 41; opening 41 extends across the upper central portion of the tubing to permit access to a well 42 in a high-purity graphite boat 43 supported within tube 40. A copper tube 44 extends into one end of glass tube 40; the end of tube 44 adjacent boat 43 is soldered to a conductive screw 45 to seal that end of the tube. Screw 45 extends into electrical and mechanical contact with boat 43. At the opposite end of tube 40, a similar copper tube 46 is correspondingly sealed and electrically connected to boat 43 by a screw 47. Copper tubes 44 and 46 are supported by two wax plugs 48 and 49 which also serve to seal the two ends of tube 40.

A copper tube 50 of substantially smaller diameter than tubing 44 extends within tube 44 and is connected to a water source 51 through a valve 52. A similar reduced-diameter tube 53 extends into tube 46. The end of copper tube 44 opposite boat 43 is connected to tubing 53 by means of a rubber hose 54 or similar electrically insulating conduit, and tube 46 leads to a drain 55. Two heat-resistant glass tubes 56 and 57 extend through wax plugs 48 and 49 respectively into the opposite ends of tube 40; tubes 56 and 57 are connected to a hydrogen reservoir 58 by means of a conduit 59, a valve 60 being interposed in conduit 59 between tubes 56, 57 and hydrogen tank 58. A cylindrical glass cover 61 is slideably mounted on tube 40 to permit covering most of opening 41, and a thermocouple 62 extends through an opening 63 in cover 61 and through a smaller opening (not shown) in tube 40 into boat 43, the end of thermocouple 62 being located immediately below well 42 (see FIGURE 5).

Figure 5:
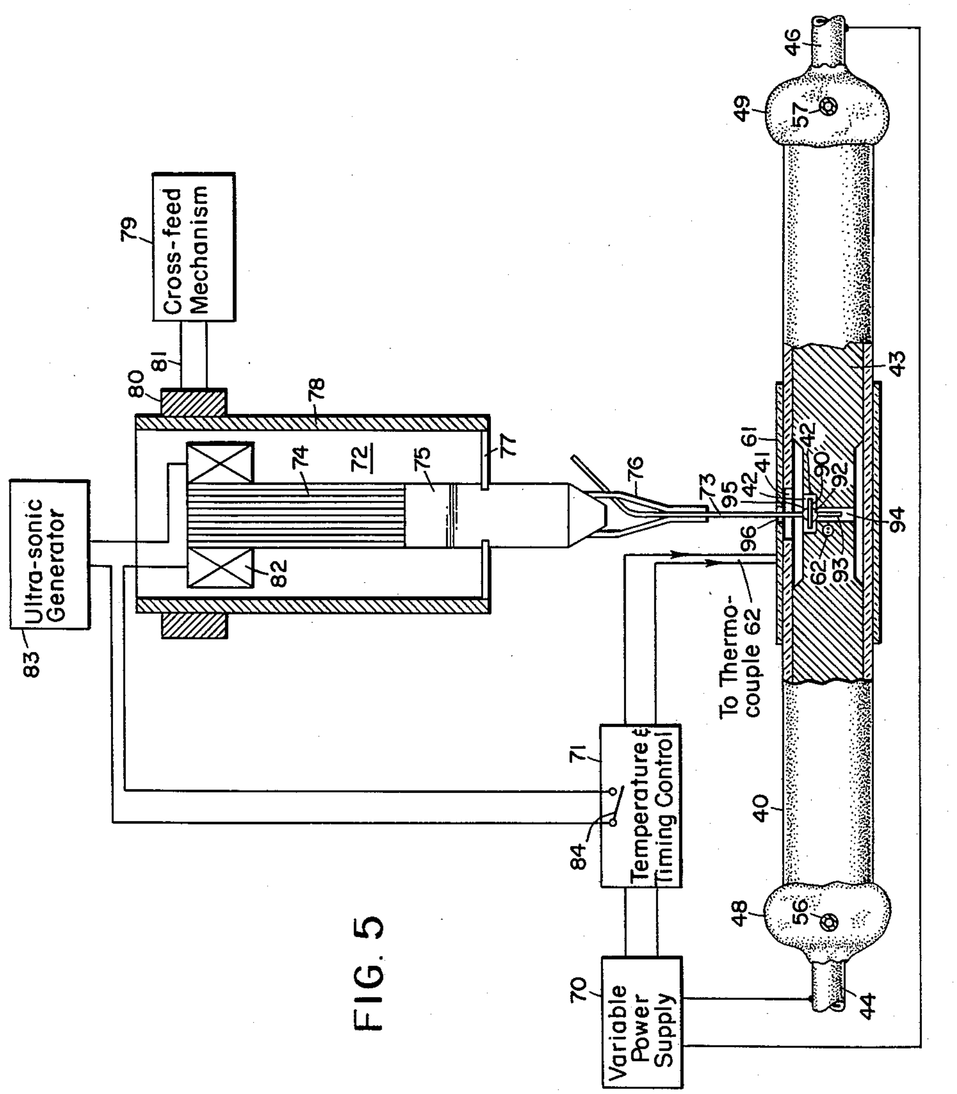
FIGURE 5 is a partially sectionalized, partially schematic elevation view of the process apparatus of FIGURE 4.

FIGURE 5, which comprises a partially sectionalized elevation view of the apparatus of FIGURE 4, shows the vibratory apparatus employed in carrying out the inventive method and also illustrates the electrical heating system. As shown therein, copper tubing 44 and copper tube 46 are connected to a variable power supply 70 which may, for example, constitute a conventional 120-volt, 60-cycle supply with a suitable variable output voltage transformer which supplies power to a high current stepdown transformer. Power supply 70 is preferably coupled to a temperature and timing control 71 which is connected to thermocouple 62.

The apparatus of FIGURE 5 further includes a vibration transducer <u>72</u> mechanically coupled to a vibration-translating element comprising an extremely fine wire 73; wire 73 may, for example, have a diameter of the order of 0.004 inch. Transducer <u>72</u> includes a resonant magnetostrictive driving element, indicated by laminae 74, which is maintained in mechanical contact with a resonant acoustic element 75 having an overall length equal to one-half wavelength at the desired ultrasonic vibration frequency. Resonant section 75 is mechanically coupled to vibration-translation element 73 by means of a connector member 76; connector 76 may, for example, comprise a pin vise collet holding a number 20 hypodermic needle into which a smaller size number 26 hypodermic needle is telescoped and through all of which wire 73 is threaded. Resonant section 75 is supported at its midpoint by means of a diaphragm 77 mounted on a support member 78; support member 78, in turn, is mechanically coupled to a cross-feed mechanism 79 as by a clamp 80 and a connecting element 81. A driving coil 82 is coupled to magnetostrictive element 74 and is electrically connected to an ultrasonic signal generator 83. The electrical circuit interconnecting coil 82 and signal generator 83 includes a switch 84 which is preferably incorporated in temperature and timing control 71.

When the apparatus of FIGURES 4 and 5 is placed in operation, transducer <u>72</u> is located above tube 40 with vibration-translating element 73 clear of the semi-conductor treating assembly. A wafer 90 corresponding to semi-conductor wafer 20 of FIGURE 3 is placed in well 42; in FIGURE 5, one alloy junction 92 has already been formed on wafer 90 and the lead 93 for junction 92 extends downwardly into an opening 94 in boat 43 provided for this purpose. Assuming that n-type germanium is employed as the semi-conductor, as indicated in the specific embodiment of the process described above, a small pellet 95 of indium is deposited on the upper surface of semi-conductor wafer 90. Cover 61 is then moved over opening 41 in tube 40, leaving only a relatively small opening 96 facing transducer 72. Variable supply 70 is then energized to pass an electrical current through boat 43 by means of the electrical connection thereto provided by copper tubes 44 and 46. When the boat reaches a temperature of approximately 350° C., temperature and timing control 71 operates to reduce the current from variable power supply 70 and maintain the temperature relatively constant. The temperature control unit also controls valve 52 (FIGURE 4) which may be opened to circulate cold water through tubes 50, 44, 54, 53 and 46 in the named sequence which facilitates rapid cooling of the system on completion of the cycle and also keeps wax seals 48 and 49 from melting. Throughout the heating process, valve 60 is held open to maintain a flow of hydrogen around boat 43 and through opening 96 into the atmosphere to prevent oxidation of germanium wafer 90 or indium pellet 95. The hydrogen from reservoir 58 need not be pure; it is preferably mixed with a substantial quantity of nitrogen or other inert gas to reduce the possibility of an explosion. Of course, opening 96 is made as small as possible consistent with effective operation of the apparatus in order to prevent an undue loss of the hydrogen-nitrogen gas mixture.

As soon as pellet 95 has been melted, cross-feed mechanism 79 is actuated to lower transducer 72 into the position illustrated in FIGURE 5 with vibration-translatng wire 73 in contact with the molten indium. Timing control 71 then closes switch 84 to energize magnetostrictive transducer 72 and vibrate wire 73 at an ultrasonic frequency. At the same time, wire 73 is preferably vibrated at a relatively low frequency, as described above; this may be accomplished by adjusting the output frequency from ultrasonic generator 83 to a frequency slightly different from the resonant frequency of transducer 72 so that the beating of the two gives rise to a low frequency component superimposed on the ultrasonic motion. Although the effect has not been closely analyzed, it seems probable that the gross or low-frequency vibration assists in internal mixing of the indium, while the ultrasonic frequency vibration provides for improved wetting of wire 73 and the germanium wafer 90 by the indium because of the cavitation action of the liquid indium.

After a predetermined period, fifteen seconds in the embodiment detailed above, switch 84 is opened to deenergize the vibration transducer. Shortly thereafter, timing control 71 actuates variable power supply 70 to increase the current passed through boat 43 and raise the boat temperature to the desired alloying temperature of 525° C. As indicated above, this alloying temperature is maintained for approximately one minute. During the alloying period, timing control 71 again closes switch 84 to energize transducer 72 for additional interval (30 seconds in the given example). Subsequently, the timing control opens switch 84 to cut off the vibration transducer and also operates to cut off the heating current from power supply 70. When cooled below the melting point of the modifier, wire 73 is severed at a point intermediate holder 76 and cover 61, cover 61 is moved away from opening 41, and the finished transistor is removed from well 42 through opening 41.

The structure of temperature and timing control 71 may be varied to suit the requirements of the desired degree of automation of the process; it may also be dispensed with completely in which case thermocouple 61 may be connected to a suitable temperature indicator while valves 52 and 60, along with variable power supply 70 and switch 84, may be manually controlled. Vibration transducer 72 may be varied in construction as desired; the transducer employed in carrying out the process may conveniently comprise an ultrasonic soldering iron of the type now generally available commercially. The particular structure illustrated for transducer 72 is a simplified version of the ultrasonic soldering iron manufactured by Mullard Ltd. of London, England and designated by that company as type E7587M using power unit type E7595M, which is described in detail in an operating manual furnished by the manufacturer.

While particular embodiments of the present invention have been shown and described, it is apparent that changes and modifications may be made without departing from the invention in its broader aspects. The aim of the appended claims, therefore, is to cover all such changes and modifications as fall within the true spirit and scope of the invention.

I claim:

1. The method of preparing an alloy-type junction upon a selected surface of a semi-conductor comprising the following steps: depositing upon said surface a modifier having a melting point substantially below the melting point of said semi-conductor; heating at least a portion of said modifier to a temperature above the melting point of said modifier and below the melting point of said semi-conductor for a predetermined period to melt a portion of said modifier and dissolve a portion of said semi-conductor into said molten modifier to form a junction comprising an alloy of said modifier and said semi-conductor; contacting said modifier with a vibration-translating element during at least a portion of said period when said modifier is heated above its melting point; subjecting said vibration-translating element to vibration at an ultrasonic frequency for a preselected portion of the time during which said element is in contact with said modifier; and further subjecting said vibration-translating element to vibration at a relatively low frequency for a preselected portion of the time during which said element is in contact with said modifier.

2. The method of preparing an alloy-type junction upon a selected surface of a semi-conductor comprising the following steps: depositing upon said surface a modifier having a melting point substantially below the melting point of said semi-conductor; heating at least a portion of said modifier to a temperature above the melting point of said modifier and below the melting point of said semi-conductor for a predetermined period to melt a portion of said modifier and dissolve a portion of said semi-conductor into said molten modifier to form a junction comprising an alloy of said modifier and said semi-conductor; contacting said modifier with a vibration-translating element during at least a portion of said period when said modifier is heated above its melting point; subjecting said vibration-translating element to vibration at an ultrasonic frequency for a preselected portion of the time during which said element is in contact with said modifier; and further subjecting said vibration-translating element to vibration at a relatively low frequency for a preselected portion of the time during which said element is in contact with said modifier, said ultrasonic and low frequency vibration steps being concurrent.

3. The method of preparing an alloy-type junction upon a selected surface of a semi-conductor comprising the following steps: depositing upon said surface a modifier having a melting point substantially below the melting point of said semi-conductor and in which said semi-conductor is soluble; heating said modifier to a first temperature slightly above the melting point of said modifier for a predetermined period to melt said modifier and maintaining said modifier approximately at said first temperature; contacting said molten modifier with a vibration-translating element; subjecting said vibration-translating element to vibration within a predetermined frequency range during at least a preselected portion of said period while in contact with said molten modifier; thereafter heating said modifier to an alloying temperature substantially higher than said first temperature but below the melting point of said semi-conductor for a predetermined alloying period to dissolve a portion of said semi-conductor into said molten modifier; subjecting said vibration-translating element to further vibration within a predetermined frequency range for a preselected portion of said alloying period, while in contact with said modifier; and cooling said modifier below its melting point to form between the modifier and said semi-conductor a junction comprising an alloy of said modifier and said semi-conductor.

References Cited in the file of this patent

UNITED STATES PATENTS

| | | |
|---|---|---|
| 2,426,650 | Sivian | Sept. 2, 1947 |
| 2,725,505 | Webster et al. | Nov. 29, 1955 |

FOREIGN PATENTS

| | | |
|---|---|---|
| 639,381 | Great Britain | June 28, 1950 |